(12) United States Patent
Okimoto et al.

(10) Patent No.: US 7,583,809 B2
(45) Date of Patent: Sep. 1, 2009

(54) SOUND SIGNAL PROCESSING DEVICE AND SOUND SIGNAL PROCESSING METHOD

(75) Inventors: Koyuru Okimoto, Tokyo (JP); Yuji Yamada, Tokyo (JP)

(73) Assignee: Sony Corporation (JP)

( * ) Notice: Subject to any disclaimer, the term of this patent is extended or adjusted under 35 U.S.C. 154(b) by 1039 days.

(21) Appl. No.: 10/987,685

(22) Filed: Nov. 11, 2004

(65) Prior Publication Data

US 2005/0117757 A1   Jun. 2, 2005

(30) Foreign Application Priority Data

Nov. 28, 2003   (JP)   ............................ P2003-400177

(51) Int. Cl.
*H03G 3/00* (2006.01)
*H03G 9/00* (2006.01)
*H03G 5/00* (2006.01)

(52) U.S. Cl. .................. 381/104; 381/102; 381/103; 381/98

(58) Field of Classification Search ......... 381/102–109, 381/1, 17, 18, 61–63, 96–99, 79, 56–59
See application file for complete search history.

(56) References Cited

U.S. PATENT DOCUMENTS

| | | | | |
|---|---|---|---|---|
| 5,172,358 | A * | 12/1992 | Kimura | 369/47.26 |
| 7,203,325 | B2 * | 4/2007 | Narasimhan | 381/94.1 |
| 2004/0190734 | A1 * | 9/2004 | Kates | 381/106 |

FOREIGN PATENT DOCUMENTS

| JP | 02-181507 A | 7/1990 |
|---|---|---|
| JP | 02-186812 A | 7/1990 |
| JP | 04-365210 A | 12/1992 |
| JP | 05-235674 A | 9/1993 |
| JP | 05235674 A | * 9/1993 |
| JP | 06-132749 A | 5/1994 |
| JP | 07-038356 A | 2/1995 |
| JP | 09-093063 A | 4/1997 |
| JP | 11-284463 A | 10/1999 |
| JP | 2000-004137 A | 1/2000 |
| JP | 2000-174574 A | 6/2000 |
| JP | 2001-007657 A | 1/2001 |

OTHER PUBLICATIONS

Applicant's admitted prior art, pp. 1-7 of specification.*

* cited by examiner

*Primary Examiner*—Devona E. Faulk
(74) *Attorney, Agent, or Firm*—Lerner, David, Littenberg, Krumholz & Mentlik, LLP

(57) ABSTRACT

In a sound signal processing device, the level of an output signal is controlled as a function of the level of the corresponding input signal by supplying the output signal, whose level is converted by a level converter and to which a specific frequency characteristic is added, to an automatic level control section. The amplification factor of the signal is automatically controlled so as to prevent the output signal level from exceeding an allowable range. The sound signal processing device includes a control section that variably changes the gain values of two level converters and the threshold value, which is a parameter to be used by a gain computer in the automatic level control section, as a function of the peak gain that is a defined value of an equalizer as defined by the user by way of an operation section.

4 Claims, 17 Drawing Sheets

SOUND SIGNAL PROCESSING DEVICE AND SOUND SIGNAL PROCESSING METHOD

CROSS-REFERENCE TO RELATED APPLICATIONS

The present application claims priority from Japanese Patent Application No. 2003-400177, filed in the Japanese Patent Office on Nov. 28, 2003, the entire content of which is incorporated by reference herein.

BACKGROUND OF THE INVENTION

1. Field of the Invention

This invention relates to a sound signal processing device comprising a frequency characteristic adding means for adding a desired frequency characteristic to an input sound signal and an automatic level control means for automatically controlling the signal amplification factor to prevent the output level from exceeding an allowable range. More particularly, the present invention relates to a sound signal processing device and a sound signal processing method for controlling the signal level according to the predetermined value of the frequency characteristic adding means and the value of the level conversion means of the system it belongs so as to secure a maximal dynamic range.

2. Related Background Art

Sound signal processing devices comprising an equalizer that is a frequency characteristic adding means for adding a desired frequency characteristic to a sound signal and an automatic level control means for automatically controlling the signal amplification factor so as to prevent the output level from exceeding an allowable range have been used in sound reproducing systems.

Particularly, the applicant of the present invention discloses a technology relating to an automatic level control means in Japanese Patent Application Laid-Open Publication No. 9-93063. The above patent document describes an automatic gain control circuit for equalizing the level of the input signal or limiting the level of the input signal to make its level from rising excessively.

FIG. 1 of the accompanying drawings is a schematic circuit diagram of a sound signal processing device 50 using an automatic level control means as disclosed in the above patent document. Referring to FIG. 1, the known sound signal processing device 50 comprises an equalizer 52 adapted to add a desired frequency character to digital sound input signal Din that is input to it from input terminal 51 and a downstream automatic level control section 53. The sound signal processing device 50 applies a gain computed by gain computer 54 that is a component of the automatic level control section 53 to variable gain multilayer 55. Unless noted otherwise, the unit of dB (decibel) is used for all the numerical values and the signs that indicate the gain in this letter of specification. Thus, the sound signal processing device 50 can control the level of the output signal of the equalizer 52 and obtain digital sound output signal Dout of the system it belongs. A level converter 57 for converting the level of the digital sound input signal Din supplied to the input terminal 51 is arranged upstream relative to the equalizer 52. A level converter 58 for converting the level of the output signal of the automatic level control section 53 is arranged downstream relative to the automatic level control section 53. The system provides an effect of preventing the signal amplified by the equalizer 52 from going beyond an allowable range and being distorted when it becomes the output signal Dout.

FIG. 2 is a schematic circuit diagram of the gain computer 54 in the automatic level control section 53 of FIG. 1, showing the configuration thereof. The output signal to which a specific frequency characteristic is added by the equalizer 52 is input to the input terminal 59 and converted into a logarithmic value x by a log converting section 60 and then supplied to adder 61. A threshold value th to which a negative sign is added is also supplied from threshold holding section 62 to the adder 61. Thus, the adder 61 computes the difference between the output signal (value x) of the equalizer that is converted into a logarithmic value and the threshold value th. The threshold value th of this known device refers to that of the maximum output level that the automatic level control section 53 can output and corresponds to the threshold value th in FIG. 3 that illustrates the input/output characteristics of the automatic level control section 53. The difference computed by the adder 61 is then supplied to multiplier 63 that is adapted to multiply it by −1, which is a coefficient. The difference computed by the adder 61 is also used as the base of the switching control signal of switch 65. The multilayer 63 multiplies the difference by −1 and supplies the product to anti-log converting section 64. The anti-log converting section 64 reduces the value x that is multiplied by −1 to an anti-logarithmic value and supplies the obtained value to terminal to be selected 65a of the switch 65. The switch 65 has terminal to be selected 65b in addition to the terminal to be selected 65a. The terminal to be selected 65b is connected to coefficient holding section 66 that holds coefficient 1. Thus, as the switch 65 turns movable piece 65c either to the terminal to be selected 65a or the terminal to be selected 65b according to the switching control signal that is based on the difference, either the anti-logarithmic value or the coefficient 1 is selected as the output of the switch 65. As pointed out above, the difference that is the difference (x−th) of the output signal (value x) of the equalizer and the threshold value (th) is output from the adder 61 when the difference (x−th) exceeds 0 ((x−th)>0) and hence the level of the value x is higher than the threshold value th, the difference operates as switching control signal for connecting the movable piece 65c of the switch 65 to the terminal to be selected 65a so that consequently the movable piece 65c is connected to the terminal to be selected 65a. As a result, the gain computer 54 supplies a value the suppresses the difference between the output signal of the equalizer and the threshold value th to variable gain multilayer 55 in FIG. 1. When, on the other hand, the difference (x−th) is not higher than 0 ((x−th)≦0) and hence the level of the value x is not higher than the threshold value th, the difference operates as switch control signal for connecting the movable piece 65c of the switch 65 to the terminal to be selected 65b so that consequently the movable piece 65c is connected to the terminal to be selected 65b. As a result, the gain computer 54 gives a one fold gain to the variable gain multilayer 55 in FIG. 1.

Assume that a flat sound input signal of 0 dB is input to the sound signal processing device 50 having the above described configuration and the equalizer 52 adds a frequency characteristic having a gain of G as peak value as shown in FIG. 4(1) to the signal. Note that FIG. 4 shows spectral graphs at a given instant. In the graphs of FIG. 4, the horizontal axis represents the frequency and the vertical axis represents the level. Assume also that the value of the gain of the level converter 57 of FIG. 1 is −A, whereas that of the gain of the level converter 58 is A (G≦A) and these values are fixed. Then, the threshold value th of FIG. 2 needs to be equal to −A in order to prevent the output signal Dout of FIG. 1 from exceeding 0 dB and being distorted if gain A is added by the level converter 58.

(1), (2) and (3) in FIG. 4 respectively illustrate the outputs at (1), (2) and (3) in FIG. 1 when a flat signal of 0 dB is input to the system. Firstly, the flat input signal of 0 dB is attenuated by A by the level converter 57 of FIG. 1 and subsequently a frequency characteristic having a gain with a peak value of G is added by the equalizer 52. Thereafter, the automatic level control section 53 shown in FIG. 1 operates for level control in such a way that output signal 56 does not exceed 0 dB and hence is not distorted if gain A is added thereto by the level converter 58. At this time, since peak level of the output of the equalizer 52 is (−A+G) and the threshold value th of FIG. 2 is −A, the value given from the gain computer 54 to the variable gain multilayer 55 in the automatic level control section 53 is equal to ((−A+G−(−A))×(−1))=−G due to the arrangement of FIG. 2. Thus, the signal level is attenuated by G from (1) so as to become (2) in FIG. 4. Then, ultimately, the signal is amplified by A as shown i (3) of FIG. 4 by the level converter 58 before it is output. The gain −A of the level converter 57, the gain A of the level converter 58 and the gain −A that is the threshold value th of FIG. 2 are constant and never vary regardless of the characteristic that is added by the equalizer 52. Therefore, if G<A, it will be understood that a dynamic range loss of (A−G) arises in the signal processing operation as shown in (1) of FIG. 4.

Assume here that a volume is added to the sound signal processing device 50 of FIG. 1 so as to control the sound volume of the entire system. The volume 59 is arranged most downstream in the system of FIG. 1 such that it can be controlled independently. Since the volume 59 is independent of the equalizer and the automatic level control section, if the level control operation is conducted or not depends solely on the input level of the signal. If the gain value of the volume 59 is −A and 0 dB is input to the system, the output at (1) and the one at (2) in FIG. 5 are entirely same as those shown in FIG. 4 (as shown in (1) and (2) in FIG. 6) and the output at (3) in FIG. 5 is same as the one shown in (3) of FIG. 6 because it is obtained by shifting (3) in FIG. 4 by the gain value −A of the volume 59 in FIG. 5. In this case, if the level converter 58 is variable and it is known that the level is raised by A at the level converter 58 and then lowered by −A at the volume 9, 0 dB can be selected for the gain value of the level converter 58 and that of the volume 59. If 0 dB is selected for the gain value of the level converter 58 and that of the volume 59, the output signal Dout would not exceed 0 dB and become distorted. Therefore, it is not necessary to conduct a level control operation as shown in (2) of FIG. 6 by operating the level control section 53. However, a level control operation that is supposed to be unnecessary as described above may have to be conducted since the gain −A of the level converter 57, the gain A of the level converter 58 and the threshold value th of FIG. 2 are always fixed.

Thus, a known sound signal processing device comprising an equalizer and an automatic level control section as principal components thereof is accompanied by a problem that a dynamic range loss may arise as pointed out earlier and a problem that a level control operation that is supposed to be unnecessary may have to be conducted. These problems give rise to degradation of the sound quality.

SUMMARY OF THE INVENTION

In view of the above identified circumstances, it is therefore an object of the present invention to provide a sound signal processing device and a sound signal processing method for conducting a level control operation, using the equalizer and automatic level control section while always securing a maximal dynamic range. Another object of the present invention is to provide a sound signal processing device and a sound signal processing method adapted to conduct a minimally required level control operation, while always securing a maximal dynamic range.

In an aspect of the present invention, the above objects are achieved by providing a sound signal processing device comprising: a first level converting means for converting the level of the input sound signal; a frequency characteristic adding means for adding a desired frequency characteristic to the output signal of the first level converting means; a level control means for controlling the level of the signal having the frequency characteristic added by the frequency characteristic adding means; a second level converting means for converting the level of the output signal of the level control means; and a control means for variably changing the parameter of the level control means and the gain of the first level converting means and that of the second level converting means.

In another aspect of the invention, in order to achieve the above objects, there is provided a sound signal processing method comprising: a first level converting step of converting the level of the input sound signal; a frequency characteristic adding step of adding a desired frequency characteristic to the sound signal having the level converted in the first level converting step; a level control step of controlling the level of the signal having the frequency characteristic added in the frequency characteristic adding step; and a second level converting step of converting the level of the signal having the level controlled in the level control step; the parameter of the level control step and the gain of the first level converting step and that of the second level converting step being made to variably change.

Thus, a sound signal processing device and a sound signal processing method respectively comprise a frequency characteristic adding means and level control means and a frequency characteristic adding step and level control step and are adapted not to fix but to variably change the parameter used by the level control means, the value of the first level converting means and that of the second level converting means and the parameter used in the level control step, the value of the first level converting step and that of the second level converting steps.

Thus, since a sound signal processing device comprising a frequency characteristic adding means and a level control means according to the invention is adapted not to fix but to variably change the parameter used by the control means and the values of the first and second level converting means, it is possible to automatically control the signal amplification factor to prevent the output level from exceeding an allowable range, while always securing a maximal dynamic range. Additionally, depending on the method for variably changing the parameter, it is possible to realize a sound signal processing device comprising a level control means adapted to conduct a minimally required level control operation. Then, as a result, it is possible to improve the problem of degradation of the sound quality by which the above described known technique is accompanied in the signal processing operation.

Thus, since a sound signal processing method comprising a frequency characteristic adding step and a level control step according to the invention is adapted not to fix but to variably change the parameter used in the control step and the gain of the first level converting step and that of the second level converting step, it is possible to automatically control the signal amplification factor to prevent the output level from exceeding an allowable range, while always securing a maximal dynamic range. Then, as a result, it is possible to improve the problem of degradation of the sound quality by which the above-described known technique is accompanied in the signal processing operation.

DETAILED DESCRIPTION OF THE PREFERRED EMBODIMENTS

Figure 7:
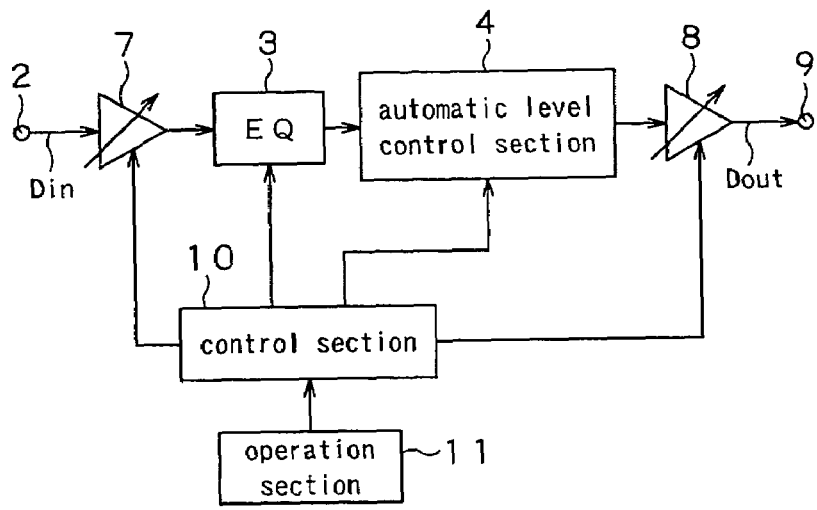
FIG. 7 is a schematic block diagram of the first embodiment of sound signal processing device according to the invention.

Now, the present invention will be described by referring to the accompanying drawings that illustrate preferred embodiments of the invention. FIG. 7 is a schematic block diagram of the first embodiment of sound signal processing device 1 of the invention. The sound signal processing device 1 comprises an equalizer 3 adapted to add a desired frequency characteristic to the digital sound input signal Din coming from input terminal 2 and a downstream automatic level control section 4. The sound signal processing device 1 also comprises a level converter 7 arranged upstream relative to the equalizer 3 and adapted to convert the level of the digital sound input signal Din and a level converter 8 arranged downstream relative to the automatic level control section 4 and adapted to convert the level of the output of the automatic level control section 4. The sound signal processing device 1 further comprises a control section 10 for variably changing the parameter of the automatic level control section 4, the value of the level converter 7 and that of the level converter 8 as a function of the set value of the equalizer 3 that is selected by the user by way of an operation section 11. The digital sound output signal Dout whose level is converted by the level converter 8 is led out from the output terminal 9.

The sound signal processing device 1 controls the output signal level as a function of the input signal level by converting the level by means of the level converter 7, adding a specific frequency characteristic to the signal by means of the equalizer 3 and supplying the output signal of the equalizer 3 to the automatic level control section 4. In short, the signal amplification factor is automatically controlled so as to prevent the output signal level from exceeding an allowable range.

Particularly, the sound signal processing device variably changes the gain values of the level converter 7, that of the level converter 8 and the parameter that is used in the automatic level control section 4 by means of the control section 10 as a function of the peak gain G that is the set value of the equalizer 3 selected by the user by way of the operation section 11. The expression of peak gain G as used herein refers to the highest gain of the frequency characteristic defined by the equalizer 3. In other words, it refers to a point where the frequency characteristic shows the largest gain.

The parameter of the automatic level control section 4, the gain values of the level converter 7 and that of the level converter 8 are made to variably change as a function of the peak gain G of the equalizer 3 by the sound signal processing device 1 instantaneously or within a certain time span at the timing defined for the equalizer 3. When they are made to change instantaneously, the control section 10 changes the parameter, the gain value of the level converter 7 and that of the level converter 8 instantaneously by referring to the peak gain G for each sample. When they are made to change within a certain time span, on the other hand, the control section 10 changes the parameter and the gain values by carrying out an integral operation for every eight samples, for example, and referring to the average level of the eight samples.

Figure 8:
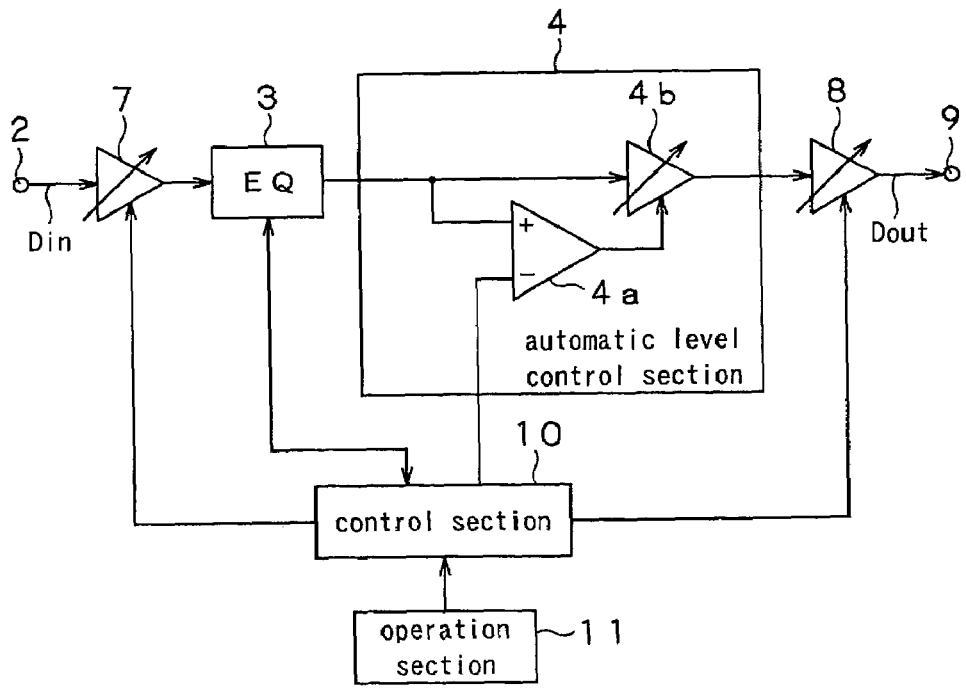
FIG. 8 is a schematic block diagram of the automatic level control section of the first embodiment, showing the configuration thereof.

As shown in FIG. 8, the automatic level control section 4 includes a comparator 4a for comparing the output signal level of the equalizer 3 and the threshold value th, which will be described in greater detail hereinafter, and a variable gain multilayer 4b for multiplying the output signal of the equalizer by a variable gain according to the output of the comparator 4a.

With the above-described arrangement, the sound signal processing device 1 can control the level of the output signal of the equalizer 3 and obtain the output signal Dout of the system.

As described above, in the first embodiment of sound signal processing device of the present invention, the control section 10 variably changes the gain values of the level converter 7 and the level converter 8 as a function of the peak gain G of the equalizer 3. Additionally, the control section 10 variably changes the threshold value th that is the parameter to be used by the comparator 4a in the automatic level control section 4 as a function of the peak gain G that is a set value for the equalizer 3. Thus, the system formed by the automatic level control section 4, the level converter 7 and the level converter 8 in the sound signal processing section 1 can prevent the signal Dout that is amplified by the equalizer 3 and output from the output terminal 9 from going beyond an allowable range and being distorted.

Now, the second embodiment of sound signal processing device according to the invention will be described below. This second embodiment of sound signal processing device has a configuration substantially same as the above described first embodiment of sound signal processing device. However, the sound signal processing device 21 of this embodiment differs from the sound signal processing device 1 of the first embodiment in terms of the internal configuration of the automatic level control section 4.

Particularly, in the sound signal processing device 21, the control section 10 variably changes the gain value of the level converter 7, that of the level converter 8 and the threshold value th, which is the parameter to be used by gain computer 5, which will be described in greater detail hereinafter, in the automatic level control section 4, as a function of the peak gain G that is the set value of the equalizer 3 that is selected by the user by way of an operation section 11. The expression of peak gain G as used herein refers to the highest gain of the frequency characteristic defined by the equalizer 3. In other words, it refers to a point where the frequency characteristic shows the largest gain.

The automatic level control section 4 of the sound signal processing device 21 has a gain computer 5 for computing the variable gain on the basis of the output signal level of the equalizer 3 and a variable gain multilayer 6 for receiving the variable gain as computed by the gain computer 5 and multiplying the output signal of the equalizer 3 by the supplied variable gain.

Thus, the sound signal processing device 21 can obtain the output signal Dout of the system by controlling the level of the output signal of the equalizer 3. The system comprising the automatic level control section 4, the level converter 7 and the level converter 8 prevents the signal Dout amplified by the equalizer 3 and output from the output terminal 9 from going beyond an allowable range and being distorted. Particularly, in the sound signal processing device 21, the control section 10 variably changes the gain value of the level converter 7 and that of the level converter 8 as a function of the peak gain G of the equalizer 3. Additionally, the control section 10 variably changes the threshold value th, which is the parameter to be used by the gain computer 5 in the automatic level control section 4, as a function of the peak gain G that is the set value of the equalizer 3.

Figure 9:
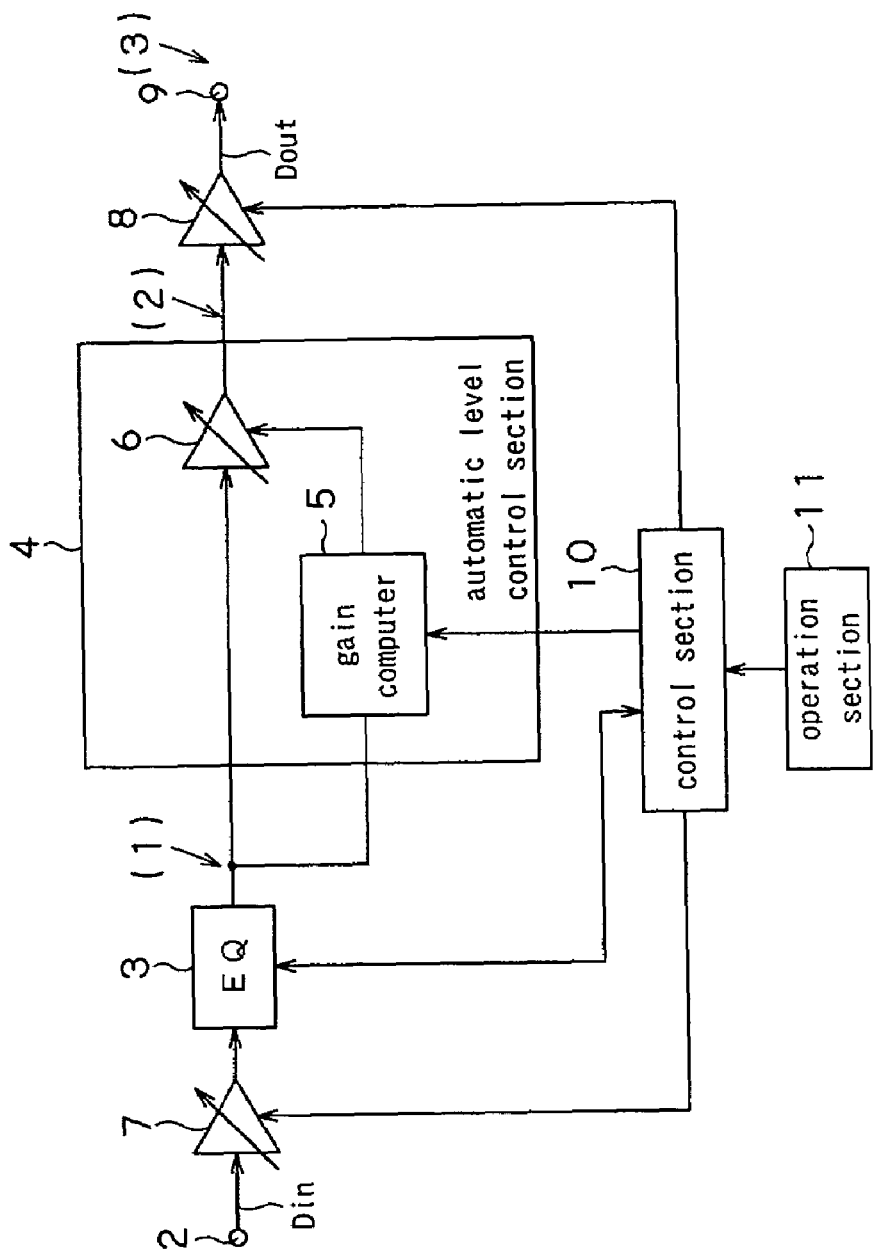
FIG. 9 is a schematic block diagram of the second embodiment of sound signal processing device according to the invention.
Figure 10:
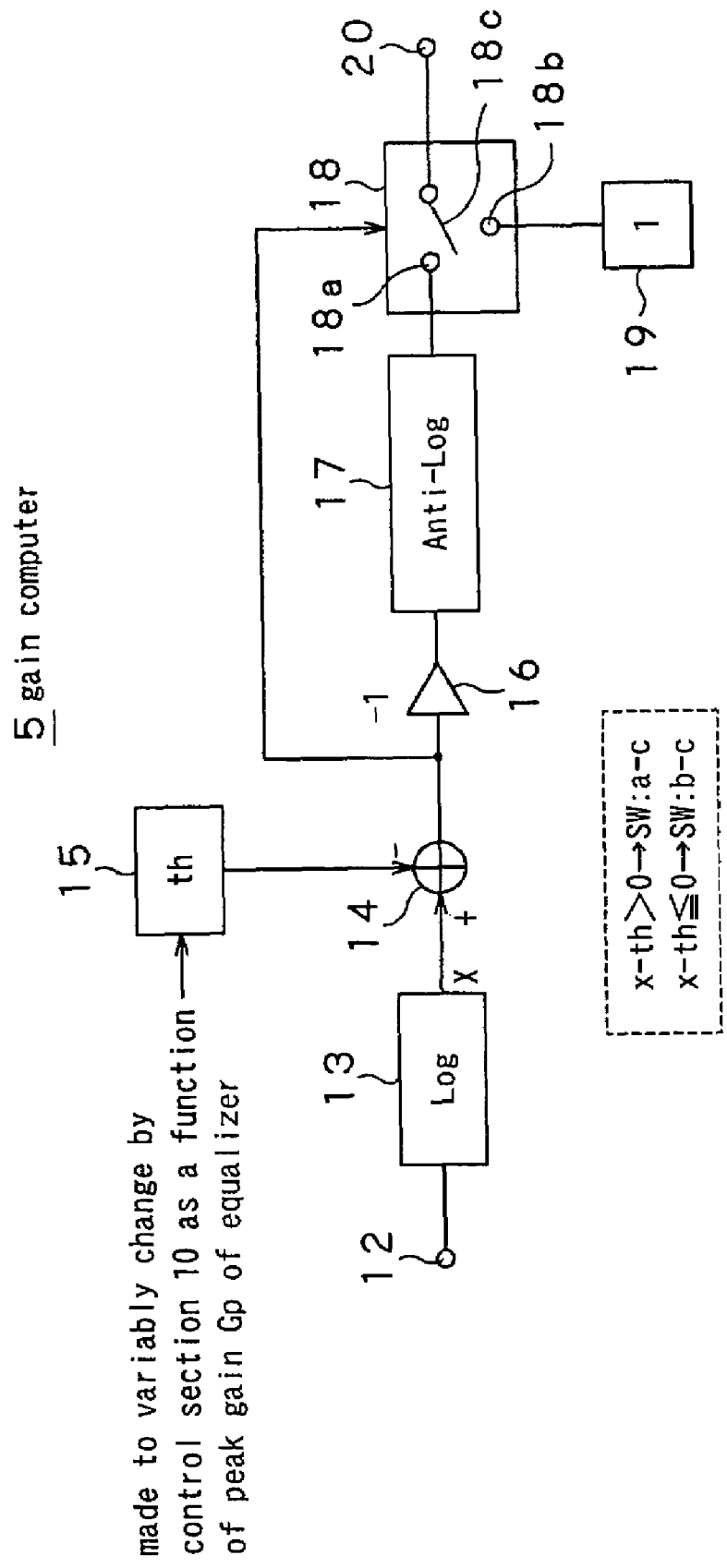
FIG. 10 is a schematic block diagram of the gain computer of the second embodiment of sound signal processing device according to the invention.

FIG. 10 is a schematic block diagram of the gain computer 5 in the automatic level control section 4 shown in FIG. 9, illustrating the configuration thereof. The output signal, which is supplied from the input terminal 12 and to which a particular frequency characteristic is added by the equalizer 3, is converted into a logarithmic value x by a log converting section 13 and then supplied to adder 14. A threshold value th to which a negative sign is added is also supplied from threshold holding section 15 to the adder 14. Thus, the adder 14 computes the difference (x−th) between the output signal (value x) of the equalizer that is converted into a logarithmic value and the threshold value th. As described above, the threshold value th is made to variably change as a function of the peak gain G of the equalizer 3.

The difference computed by the adder 14 is then supplied to multiplier 16 that is adapted to multiply it by −1, which is a coefficient. The difference computed by the adder 14 is also used as the base of the switching control signal of switch 18. The multilayer 16 multiplies the difference by −1 and supplies the product to anti-log converting section 17. The anti-log converting section 17 reduces the value x that is multiplied by −1 to an anti-logarithmic value and supplies the obtained value to terminal to be selected 18a of the switch 18. The switch 18 has terminal to be selected 18b in addition to the terminal to be selected 18a. The terminal to be selected 18b is connected to coefficient holding section 19 that holds coefficient 1. Thus, as the switch 18 turns movable piece 18c either to the terminal to be selected 18a or the terminal to be selected 18b according to the switching control signal that is based on the difference, either the anti-logarithmic value or the coefficient 1 is selected as the output of the switch 18 and led out from the output terminal 20.

The switching operation of the switch 18 proceeds in a manner as described below. The difference between the output signal (value x) of the equalizer and the threshold value (th), or (x−th) is output from the adder 14. When the difference (x−th) exceeds 0 ((x−th)>0) and hence the level of the value x is higher than the threshold value th, the difference operates as basis for the switching control signal so that consequently the movable piece 18c of the switch 18 is connected to the terminal to be selected 18a. As a result, the gain computer 5 supplies a value the suppresses the difference between the output signal of the equalizer and the threshold value th to variable gain multilayer 6 in FIG. 9. When, on the other hand, the difference (x−th) is not higher than 0 ((x−th) ≦0) and hence the level of the value x is not higher than the threshold value th, the difference operates as basis for the switch control signal so that consequently the movable piece 18c of the switch 18 is connected to the terminal to be selected 18b. As a result, the gain computer 5 gives a one fold gain to the variable gain multilayer 6 in FIG. 9.

Figure 11:
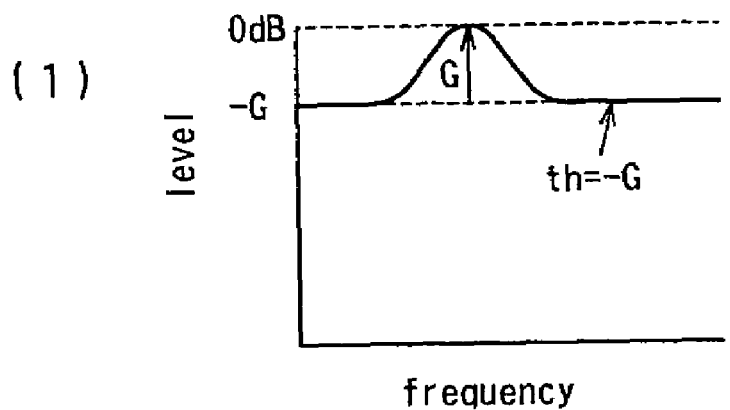
FIG. 11 shows spectral graphs illustrating an operation of the second embodiment of sound signal processing device according to the invention.
Figure 11:
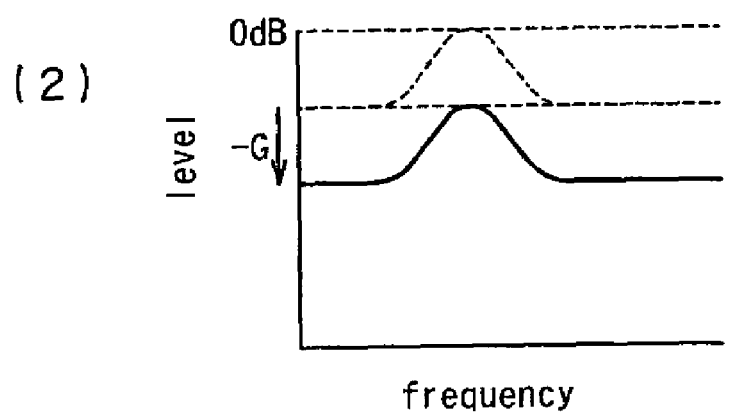
Figure 11:
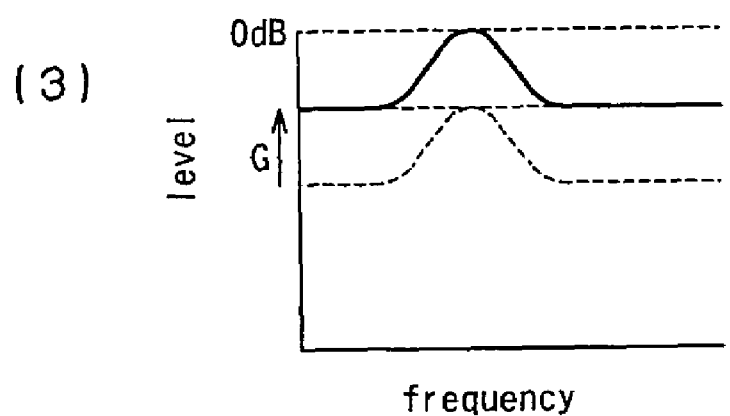

Now, the operation of the sound signal processing device 21 when it receives a flat sound input signal of 0 dB and the peak gain of the equalizer 3 as illustrated in FIG. 9 is G from a reference level will be described below by referring to FIG. 11. FIG. 11 shows the spectral graphs of an instant. In the graphs of FIG. 11, the horizontal axis represents the frequency and the vertical axis represents the signal level.

In the sound signal processing device 21, the control section 10 variably changes the gain value of the level converter 7, that of the level converter 8 and the threshold value th, which is the parameter to be used by gain computer 5 in the automatic level control section 4, as a function of the peak gain G of the equalizer 3. Therefore, when a frequency characteristic that provides a gain of G for the peak value is added by the equalizer 3 shown in FIG. 9, the gain value of the level converter 7 in FIG. 9 becomes equal to −G whereas that of the level converter 8 becomes equal to G under the control of the control section 10. Additionally, the threshold value th that is used by the gain computer 5 becomes equal to −G.

Figure 1:
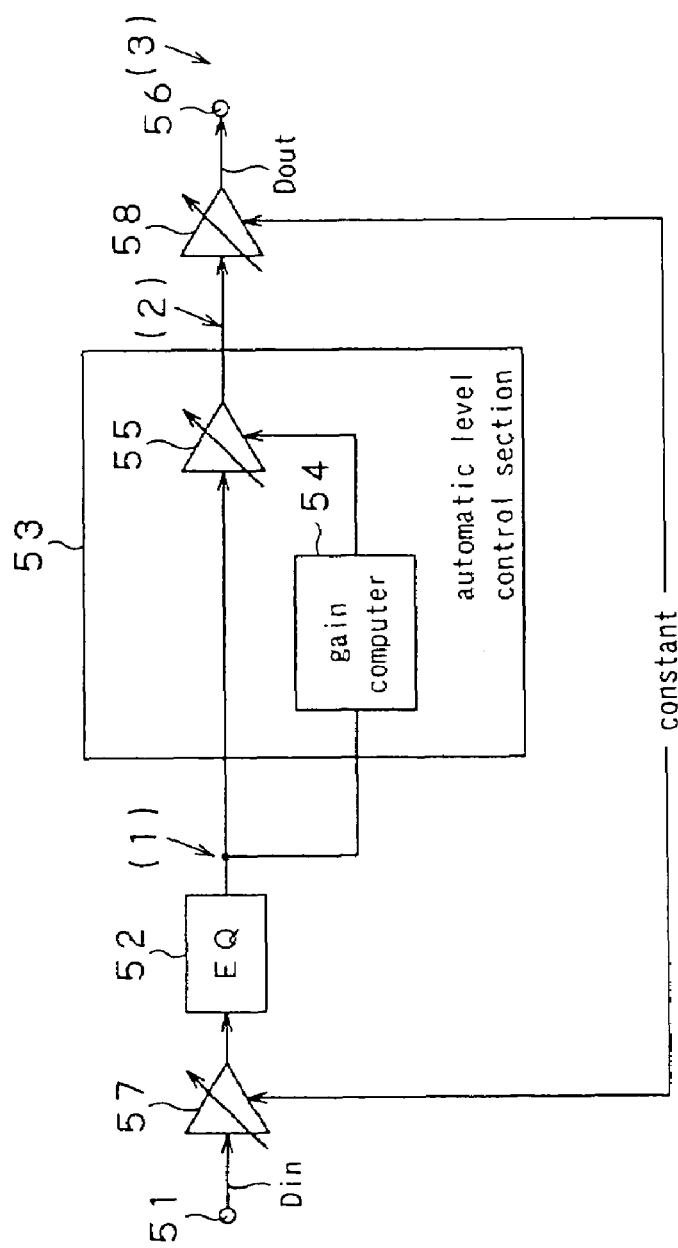
FIG. 1 is a schematic block diagram of a known sound signal processing device.
Figure 2:
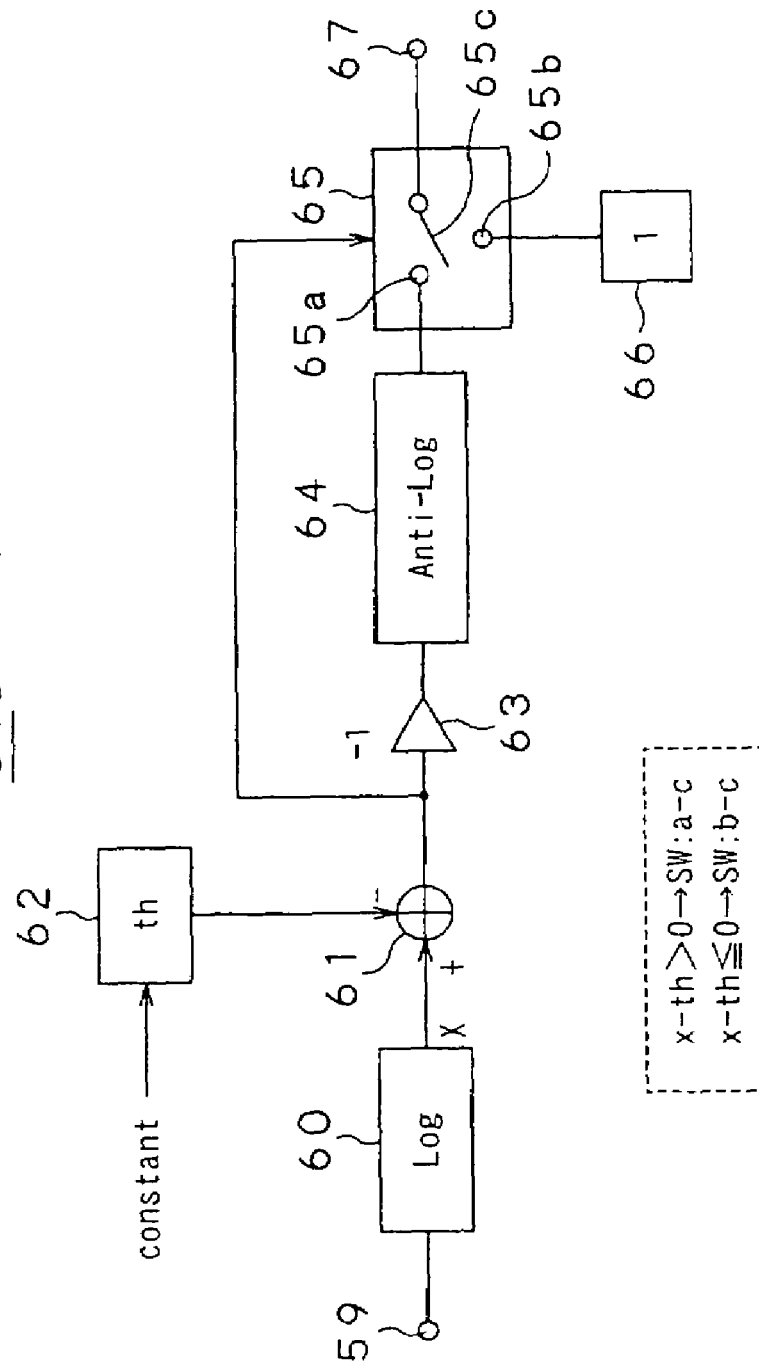
FIG. 2 is a schematic block diagram of the gain computer of the sound signal processing device of FIG. 1.
Figure 3:
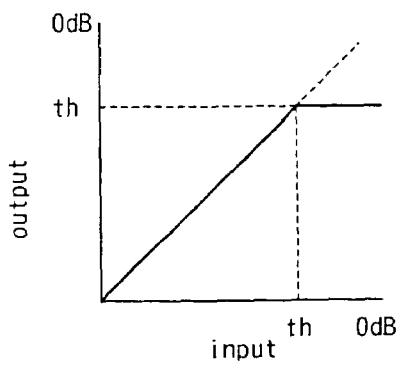
FIG. 3 is a graph illustrating the threshold value of the gain computer of FIG. 2.

Then, (1), (2) and (3) in FIG. 11 respectively illustrate the outputs at (1), (2) and (3) in FIG. 9 when a flat signal of 0 dB is input to the system. Firstly, the flat input signal of 0 dB is attenuated by gain G by the level converter 7 and subsequently a frequency characteristic having a gain with a peak value of G is added by the equalizer 3 ((1) in FIG. 11). Thereafter, the automatic level control section 4 operates for level control, using −G ((−G+G−(−G))×(−1)), or −G, so that the output signal Dout does not exceed 0 dB and become distorted when a gain of G is added at the level converter 8 (or it is amplified by the gain G at the level converter 8 from (2) of FIG. 11 and output ((3) in FIG. 11)). Thus, while the ultimate output level of (3) in FIG. 11 is same as that of the system of FIG. 1, it will be seen by comparing FIG. 11 and FIG. 4, which is used for describing the prior art, that (1) in FIG. 4 shows a dynamic range loss of (A–G) but (1) in FIG. 11 does not show such a dynamic range loss and hence this embodiment provides an improvement for the dynamic range loss in the signal processing operation.

Figure 4:
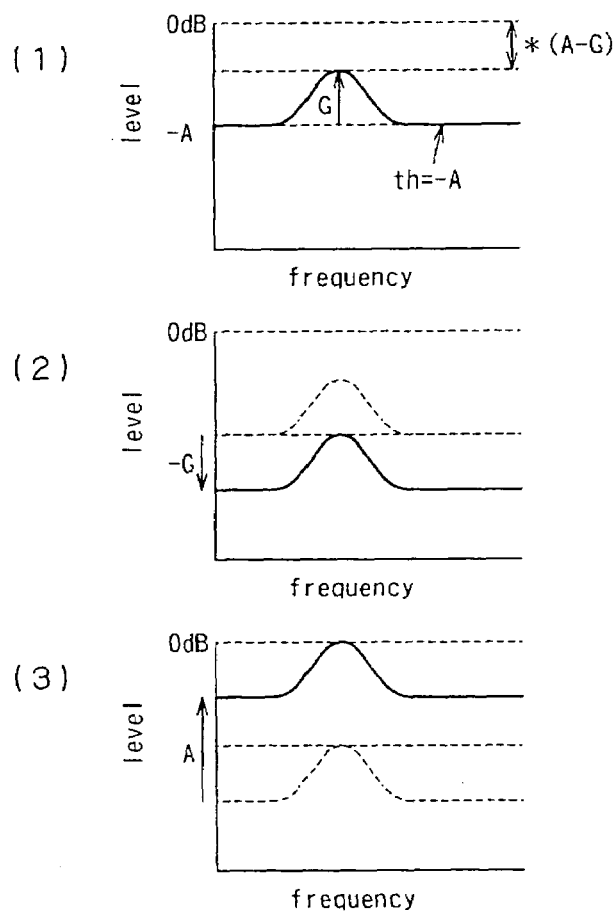
FIG. 4 shows spectral graphs illustrating an operation of the known signal processing device of FIG. 1.

In this way, as a result of variably changing the gain value of the level converter 7, that of the level converter 8 and the threshold value th of the gain computer 5 in FIG. 4 as a function of the peak gain G of the equalizer 3, it is now possible to realize a level control operation and, at the same time, secure a maximal dynamic range.

Figure 12:
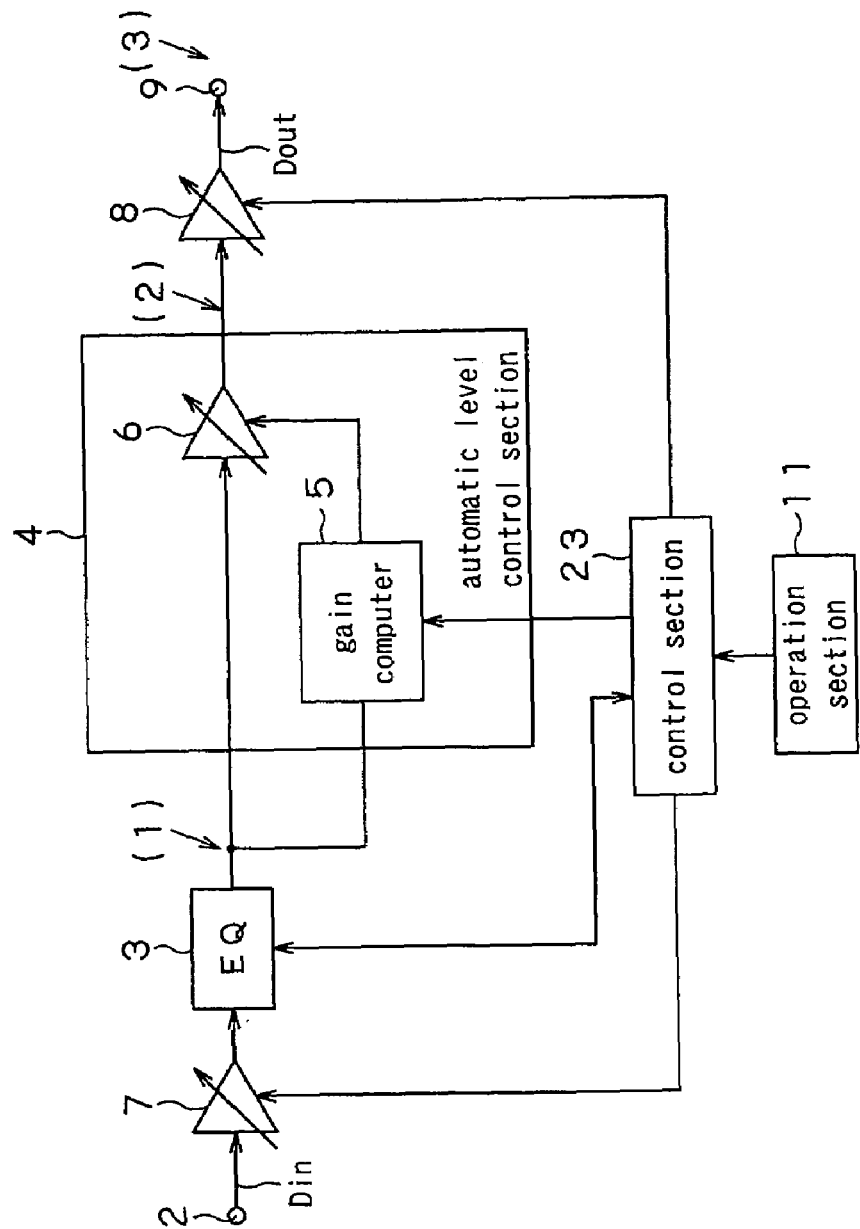
FIG. 12 is a schematic block diagram of the third embodiment of sound signal processing device according to the invention.
Figure 13:
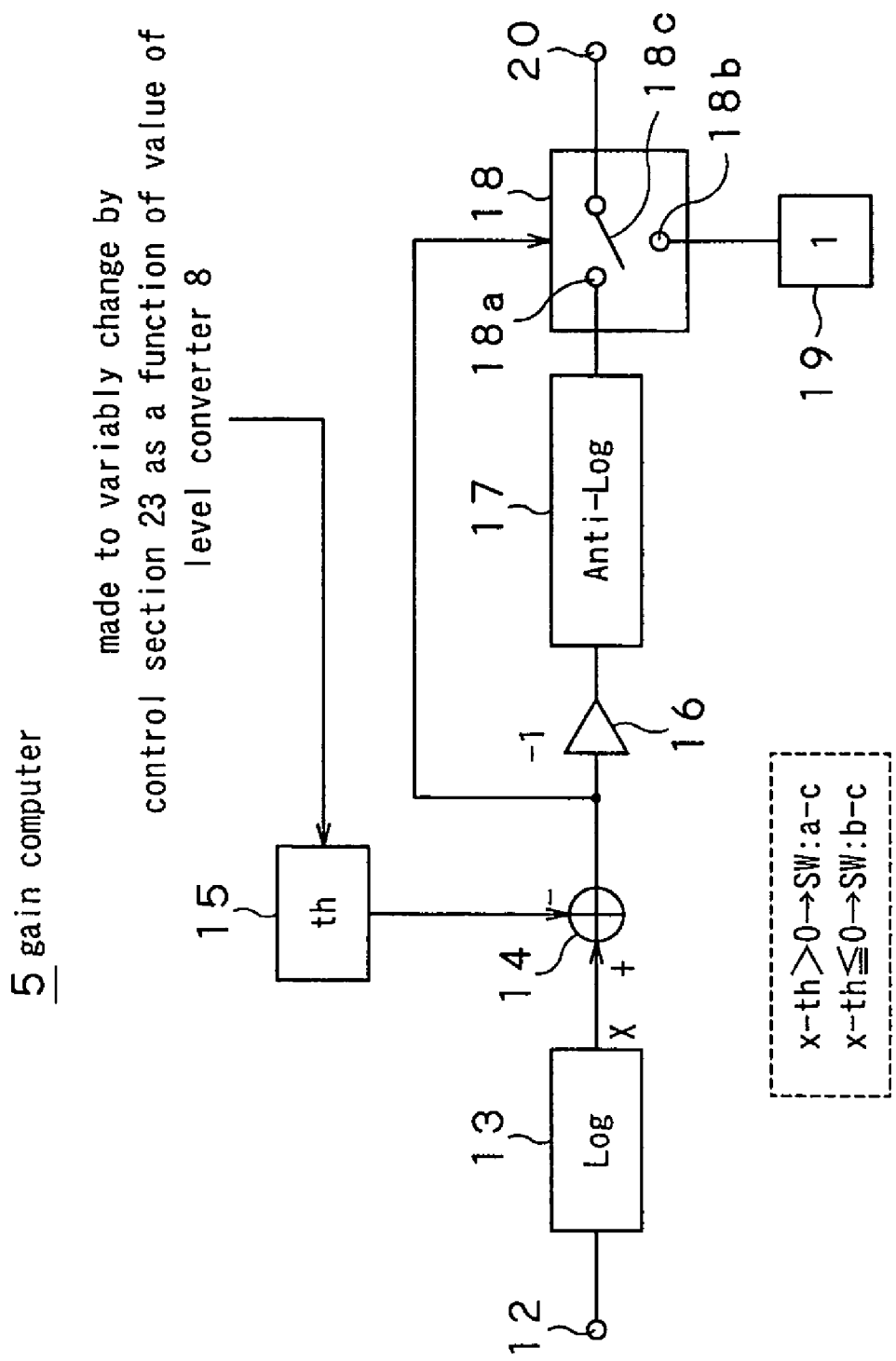
FIG. 13 is a schematic block diagram of the gain computer of the third embodiment of sound signal processing device according to the invention.

Now, the third embodiment of the present invention will be described. The third embodiment of the present invention is a sound signal processing device 22 having a configuration as shown in FIG. 12. With this embodiment, the level of the input signal is converted by the level converter 7 and the output signal level is controlled as a function of the input signal level by supplying the output signal obtained by adding thereto a specific frequency characteristic by the equalizer 3 to the automatic level control section 4. In other words, the sound signal processing device 22 is adapted to automatically control the amplification factor of the signal so as to prevent the output signal from going beyond an allowable range. In FIG. 12, the component blocks same as those of the sound signal processing device 1 of FIG. 9 are denoted respectively by the same reference symbols and will not be described further. FIG. 13 illustrates the gain computer 5 of this embodiment, showing the configuration thereof.

This sound signal processing device 22 differs from the sound signal processing device 21 of FIG. 9 in that the level converter 8 is controlled independently from the level converter 7. In other words, the control section 23 variably changes the threshold value th of the gain computer 5 of FIG. 13 as a function of the value of the level converter 8. The control section 23 variably changes the value of the level converter 7 as a function of the peak gain G of the equalizer 3.

When the peak gain of the equalizer 3 in FIG. 12 is G from a reference level, the gain value of the level converter 7 is made equal to –G as in the case of the sound signal processing device 21 of FIG. 9 as the control section 23 makes it variably change as a function of the peak gain.

Assume that the level converter 8 converts the level by V (0 dB<V<G) for example. Then, (1), (2) and (3) in FIG. 14 respectively illustrate the outputs at (1), (2) and (3) in FIG. 12 when a flat signal of 0 dB is input to the system. Firstly, the input signal is attenuated by gain G by the level converter 7 and subsequently a frequency characteristic having a gain with a peak value of G is added by the equalizer 3 ((1) in FIG. 14). It is necessary to select –V (as obtained from (–G+G–(–V))×(–1) in FIG. 13) for the threshold value th in order to prevent the output signal Dout from exceeding 0 dB and being distorted when a gain of V is added thereto by the level converter 8. Therefore, a level control operation needs to be conducted for a gain of –V from (1) in FIG. 14 (to (2) in FIG. 14). Then, the output signal is amplified by gain V by the level converter 8 to obtain a signal as shown by (3) in FIG. 14.

Figure 15:
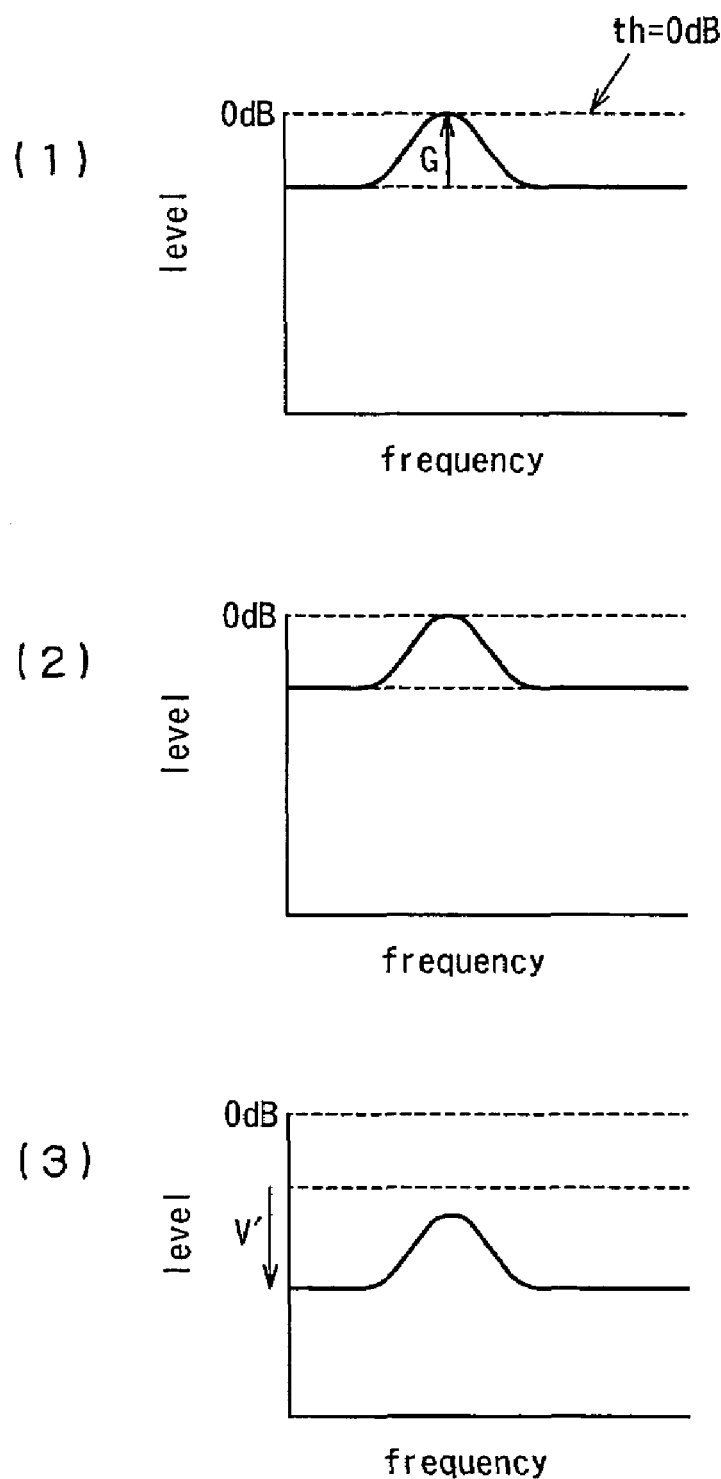
FIG. 15 shows spectral graphs illustrating another operation of the third embodiment of sound signal processing device according to the invention.

Now, (1), (2) and (3) in FIG. 15 respectively illustrate the outputs at (1), (2) and (3) in FIG. 12 when a gain value of V' (V'<0 dB) is used by the level converter 8 for a flat signal of 0 dB is input to the system. The input signal is attenuated by gain G by the level converter 7 and subsequently a frequency characteristic having a gain with a peak value of G is added by the equalizer 3 ((1) in FIG. 15). Since the gain value of the level converter 8 is V' (V'<0 dB) and hence the output signal Dout does not exceed 0 dB to become distorted if the gain is added, it is not necessary for the level control section 4 to suppress the signal level shown in (1) of FIG. 15. Therefore, a signal as shown in (2) of FIG. 15 is obtained when 0 dB is selected for the threshold value th and ultimately a signal as shown in (3) of FIG. 15 is obtained from the signal of (2) of FIG. 15 after passing through the level converter 8. This indicates that a level control operation may or may not be conducted depending on the gain value of the level converter 8 if the level of the input signal remains same.

Figure 5:
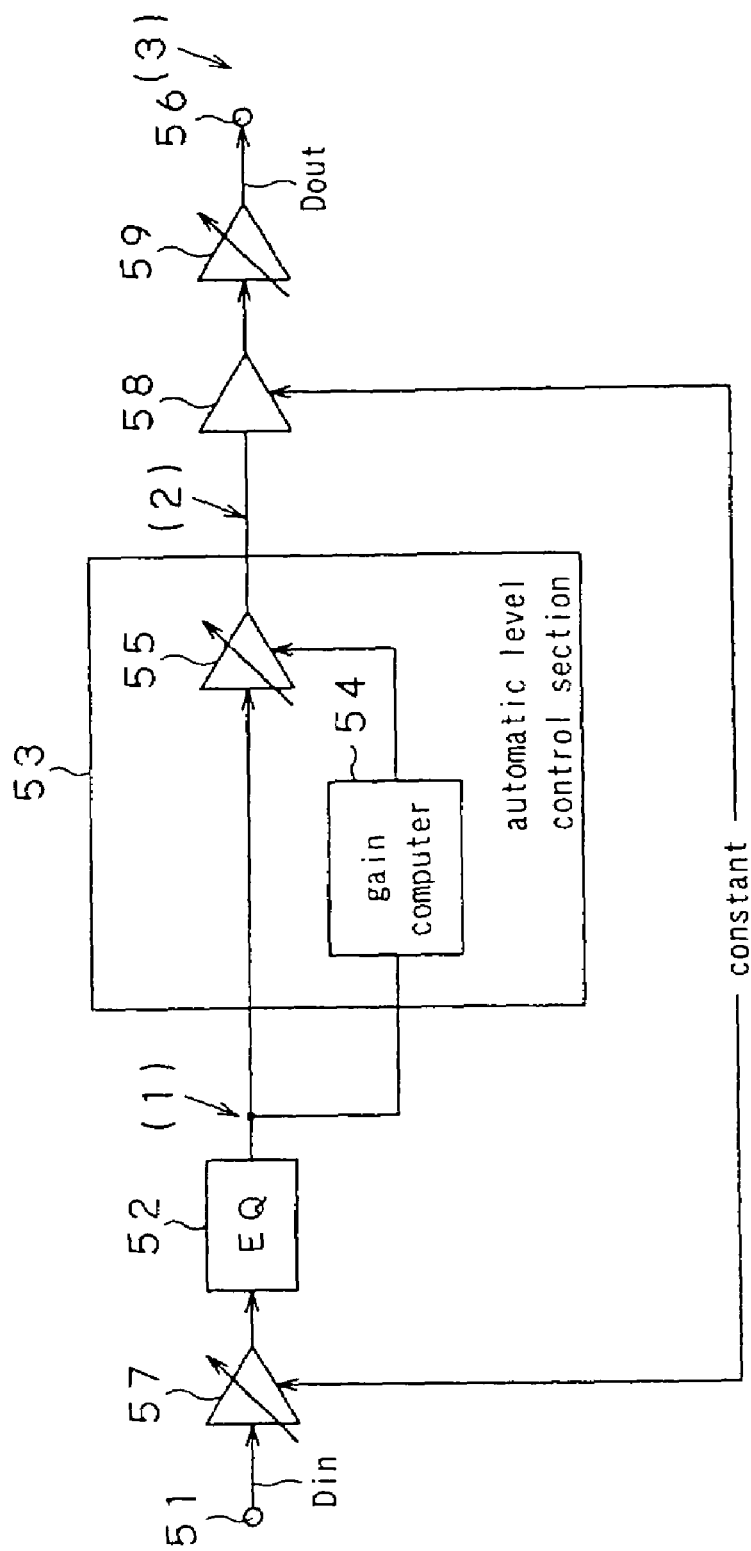
FIG. 5 is a schematic block diagram of another known sound signal processing device.
Figure 6:
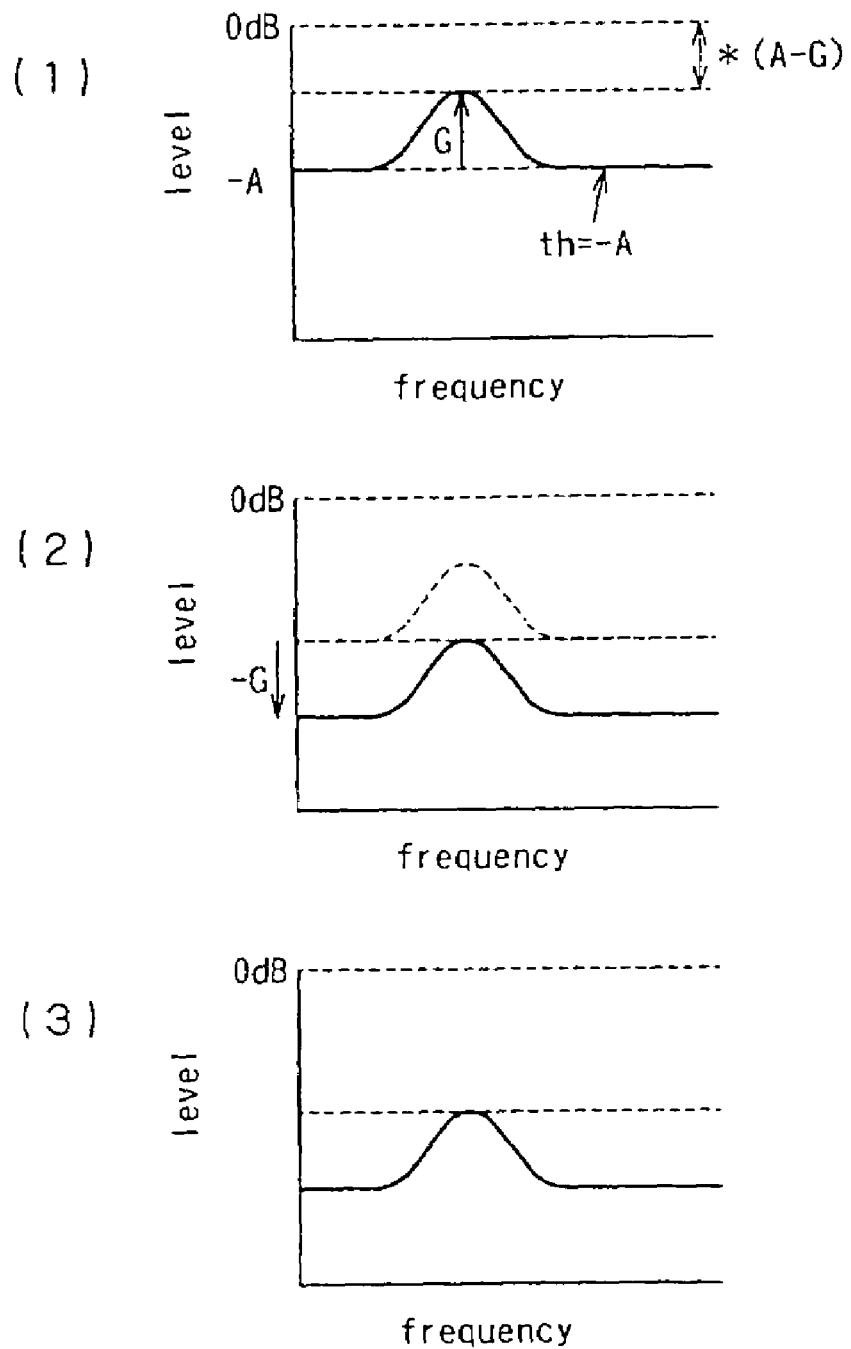
FIG. 6 shows spectral graphs illustrating the operation of the known signal processing device of FIG. 5.

In the case of the system of the prior art illustrated in FIG. 5, if a level control operation is conducted or not solely depends on the level of the input signal and hence an unnecessary level control operation may be conducted. To the contrary, in the case of the system of FIG. 12, if a level control operation is conducted or not depends not only on the level of the input signal but also on the gain value of the level converter 8. In other words, only a minimally necessary level control operation is conducted in the case of the system of FIG. 12.

Figure 14:
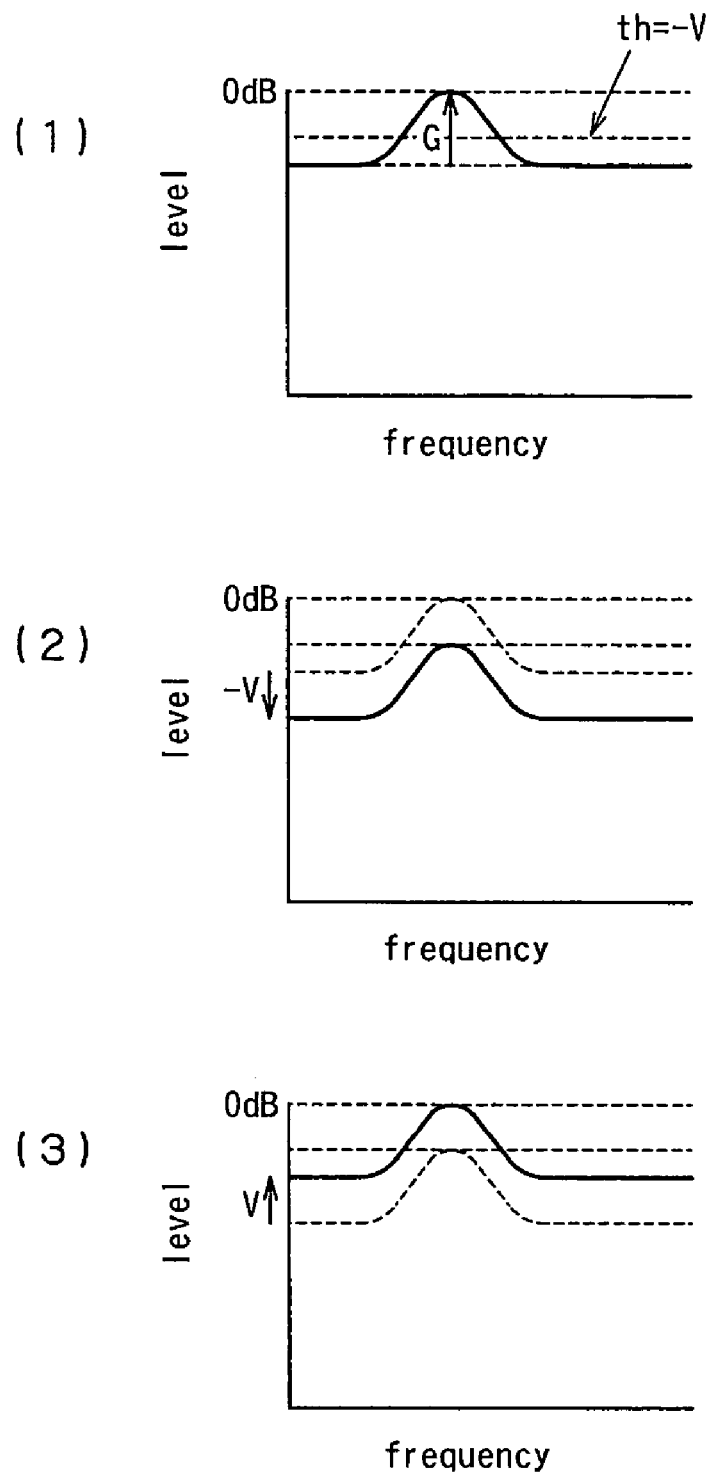
FIG. 14 shows spectral graphs illustrating an operation of the third embodiment of sound signal processing device according to the invention.

Thus, in the sound signal processing device 22 of the third embodiment, no dynamic range loss takes place in the process of obtaining an output signal as shown in (3) of FIG. 14 or (3) of FIG. 15 due to the selected parameter value unlike the case of the prior art of FIG. 4 nor an unnecessary level control operation is conducted unlike the case of the system of the prior art of FIG. 5. Therefore, it is possible to improve the problem of degradation of the sound quality in the signal processing operation.

As described above, in the sound signal processing device 22, the control section 23 variably changes the gain value of the level converter 7 of FIG. 12 as a function of the peak gain G of the equalizer 3 and can independently control the level converter 8 so as to make the threshold value th of FIG. 13 variably change as a function of the gain value of the level converter 8. Thus, with the sound signal processing device 22 of the third embodiment, only a minimally necessary level control operation is conducted while securing a maximal dynamic range.

Figure 16:
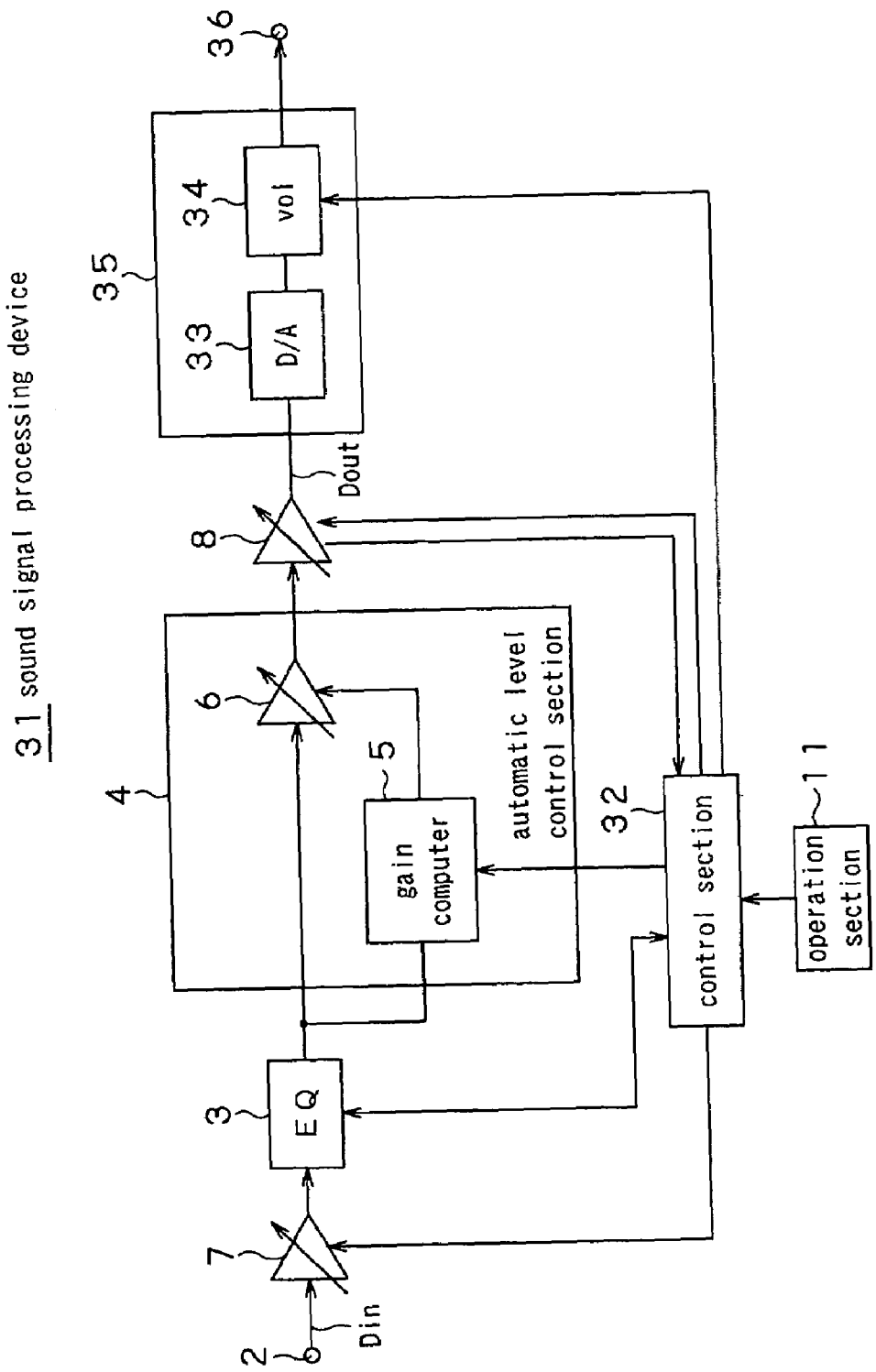
FIG. 16 is a schematic block diagram of the fourth embodiment of sound signal processing device according to the invention.

Now, the fourth embodiment of the present invention will be described below. The fourth embodiment of the present invention is a sound signal processing device 31 having a configuration as shown in FIG. 16. With this embodiment, the level of the input signal is converted by the level converter 7 and the output signal level is controlled as a function of the input signal level by supplying the output signal obtained by adding thereto a specific frequency characteristic by the equalizer 3 to the automatic level control section 4 in such a way that the amplification factor of the signal is automatically controlled so that the output signal level may not exceed an allowable range. Additionally, the sound signal processing device 31 is adapted to regulate the sound volume in the most downstream step. In FIG. 16, the component blocks same as those of the sound signal processing devices 21, 22 of FIGS. 9, 12 are denoted respectively by the same reference symbols and will not be described further.

This sound signal processing device 31 differs from the sound signal processing device 22 of FIG. 12 in that a D/A converter 33 and a volume 34 are arranged downstream relative to the level converter 8. The output of the level converter 8 is subjected to D/A conversion by the D/A converter 33 and delivered to the volume 34 that is electronically controllable.

Figure 17:
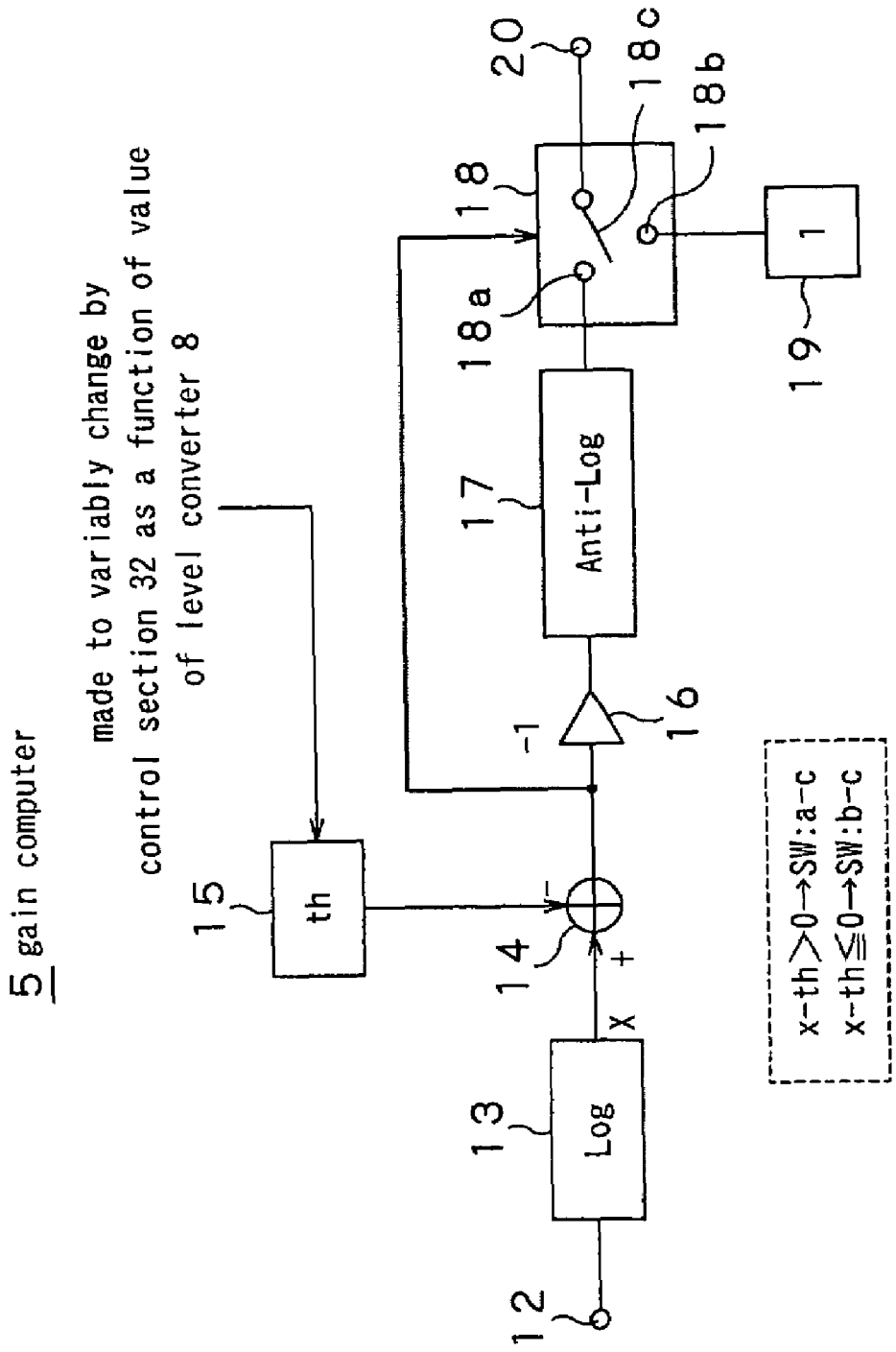
FIG. 17 is a schematic block diagram of the gain computer of the fourth embodiment of sound signal processing device according to the invention.

The gain computer 5 illustrated in FIG. 17 variably changes the threshold value th as a function of the gain value of the level converter 8 under the control of the control section 32. The gain value of the level converter 8 is also made to variably change as a function of the value selected for the volume 34. The volume 34 is defined by the user who uses operation section 11 that is connected to the control section 32. Thus, the control section 32 variably changes the gain value of the level converter 8 as a function of the value selected for the volume 34 and the threshold value th of the gain computer 5 as a function of the gain value of the level converter 8. The control section 32 also variably changes the gain value of the gain converter 7 as a function of the peak gain G of the equalizer 3.

With the above described arrangement, if the signal level of the output (digital output signal) Dout of the level converter 8 in FIG. 16 can exceed 0 dB, the overall sound volume is regulated by way of the combination of the gain value of the level converter 8 and the threshold value th of the gain computer 5. If the signal level of the output Dout cannot exceed 0 dB as described above by referring to FIG. 15, it is possible to regulate the sound volume by means of a minimal necessary level control operation of the volume 34, while securing a maximal dynamic range for the digital data.

Figure 18:
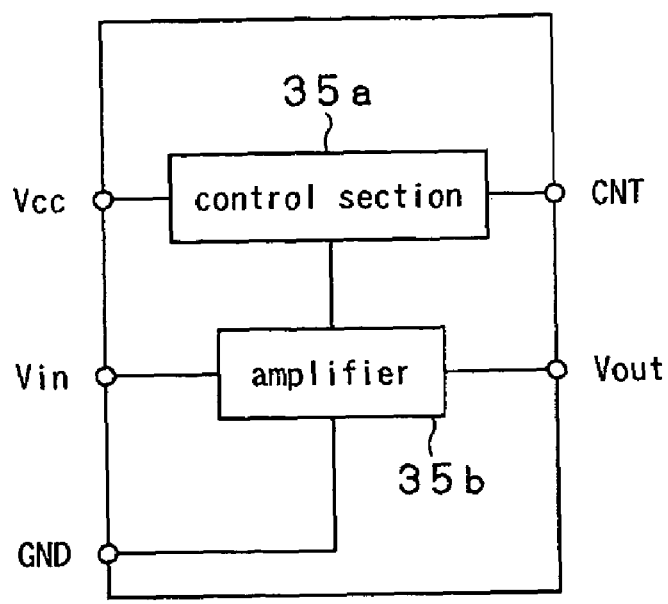
FIG. 18 is a schematic block diagram of the digital amplifier of the fourth embodiment of sound signal processing device according to the invention.
Figure 19:
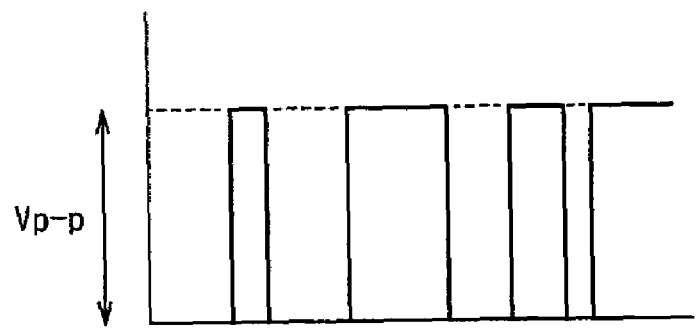
FIG. 19 is a graph illustrating the output level that is made variable by the digital amplifier of FIG. 18.

Note that, in FIG. 16, the D/A converter 33 and the electronically controllable volume 34 may be realized as a digital amplifier 12 adapted to control the output level by the input from the control terminal as will be described hereinafter. As shown in FIG. 18, the digital amplifier 12 includes a control section 35a having a terminal to which supply voltage Vcc is applied and a terminal to which control signal CNT is supplied and an amplifier 35b having a terminal to which input signal Vin is supplied, a terminal for producing output signal Vout and a terminal connected to the ground GND. The amplifier 35b amplifies the input signal Vin under the control of the control section 35a to produce the output signal Vout. The control section 35a changes the value of the amplitude level Vp-p of the pulse wave as shown in FIG. 19 by controlling the supply voltage to the digital amplifier. Thus, the digital amplifier 35 can variably change the output level.

Figure 20:
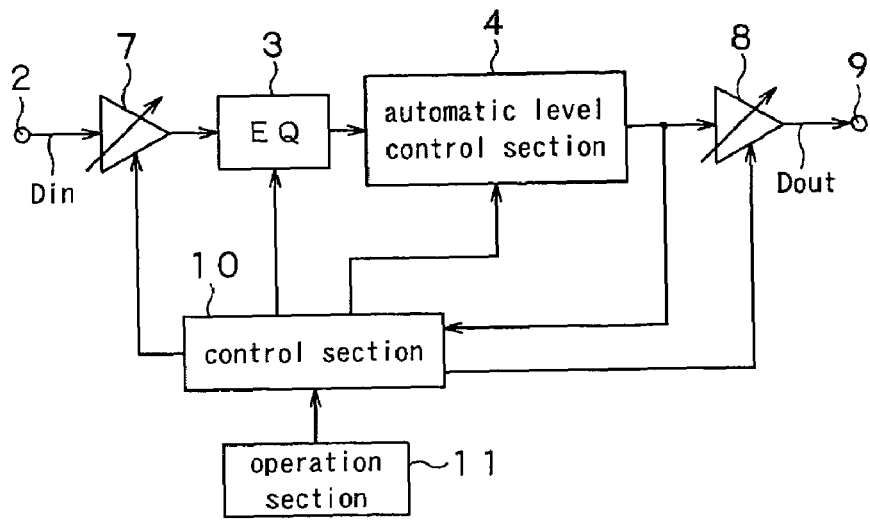
FIG. 20 is a schematic block diagram of the fifth embodiment of sound signal processing device according to the invention.

Now, the fifth embodiment of the present invention will be described below. The fifth embodiment of the present invention is a sound signal processing device 41 having a configuration as shown in FIG. 20. This embodiment is adapted to feedback type control such that the control section 10 detects the output level of the automatic level control section 4 and variably changes the parameter of the automatic level control section 4, the gain value of the level converter 7 and that of the level converter 8 as a function of the detected output level. Thus, the control operation of this embodiment differs from that of the sound signal processing device 1 of FIG. 7, in which the parameter of the automatic level control section 4, the gain value of the level converter 7 and that of the level converter 8 are made to variably change as a function of the selected value of the equalizer 3.

Thus, in the sound signal processing device 41, the system formed by the automatic level control section 4, the level converter 7 and the level converter 8 can prevent the signal Dout amplified by the equalizer 3 and output from the output terminal 9 from exceeding an allowable range and being distorted.

Figure 21:
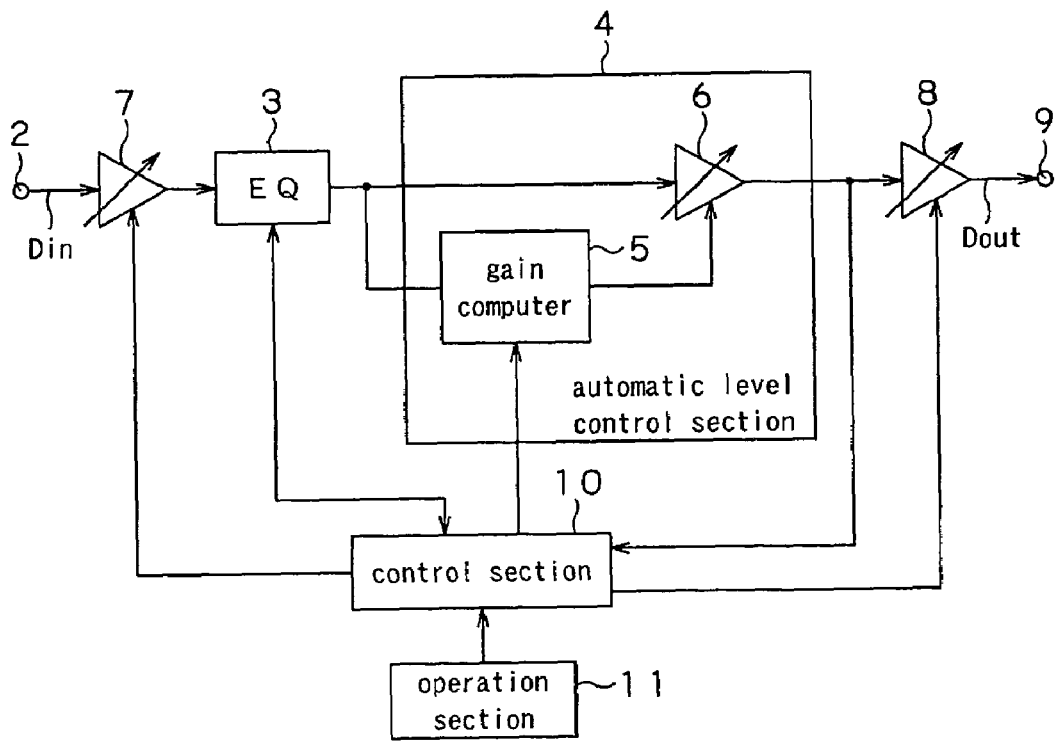
FIG. 21 is a schematic block diagram of the sixth embodiment of sound signal processing device according to the invention.

Likewise, in the sound signal processing device 42 (the sixth embodiment) as shown in FIG. 21 and corresponding to the sound signal processing device 21 of the second embodiment, the control section 10 is adapted to detect the output level of the automatic level control section 4 and variably change the parameter of the automatic level control section 4, the gain value of the level converter 7 and that of the level converter 8 as a function of the detected level.

The arrangement that the control section detects the output level of the automatic level control section 4 and variably changes the gain value of the level converter 7 and that of the level converter 8 as a function of the detected level can be applied to the sound signal processing device 22 of the third embodiment and also to the sound signal processing device 31 of the fourth embodiment.

What is claimed is:

1. A sound signal processing device comprising:
first level converting means for converting a level of an input sound signal;
frequency characteristic adding means for adding a desired frequency characteristic to an output signal of the first level converting means;
level control means for controlling a level of the signal having the frequency characteristic added thereto by the frequency characteristic adding means;
second level converting means for converting a level of an output signal of the level control means; and
control means for variably changing a parameter of the level control means and a gain of the first level converting means and a gain of the second level converting means as a function of a largest gain of the frequency characteristic added by the frequency characteristics adding means.

2. A sound signal processing device comprising:
first level converting means for converting a level of an input sound signal;
frequency characteristic adding means for adding a desired frequency characteristic to an output signal of the first level converting means;
level control means for controlling a level of the signal having the frequency characteristic added thereto by the frequency characteristic adding means;
second level converting means for converting a level of an output signal of the level control means; and
control means for variably changing a parameter of the level control means and a gain of the first level converting means and a gain of the second level converting means,
wherein the control means is adapted to variably change the parameter of the level control means and the gain of the first level converting means and the gain of the second level converting means as a function of a largest gain of the frequency characteristic added by the frequency characteristic adding means.

3. A sound signal processing method for use with a sound signal processing device, said method comprising:
a first level converting step of converting a level of an input sound signal by use of a first level converter;
a frequency characteristic adding step of adding a desired frequency characteristic to a sound signal having the level converted in the first level converting step by use of an equalizer;
a level control step of controlling a level of the signal having the frequency characteristic added thereto in the frequency characteristic adding step by use of a level control unit; and
a second level converting step of converting a level of the signal having the level controlled in the level control step by use of a second level converter;
a variably changing step of variably changing a parameter of the level control step and a gain of the first level converting step and a gain of the second level converting step by use of a control unit as a function of a largest gain of the frequency characteristic added by the frequency characteristic adding step.

4. A sound signal processing method for use with a sound signal processing device, said method comprising:

a first level converting step of converting a level of an input sound signal by use of a first level converter;

a frequency characteristic adding step of adding a desired frequency characteristic to a sound signal having the level converted in the first level converting step by use of an equalizer;

a level control step of controlling a level of the signal having the frequency characteristic added thereto in the frequency characteristic adding step by use of a level control unit; and a second level converting step of converting a level of the signal having the level controlled in the level control step by use of a second level converter;

a variably changing step of variably changing a parameter of the level control step and a gain of the first level converting step and a gain of the second level converting step by use of a control unit, wherein the parameter of the level control step and the gain of the first level converting step and the gain of the second level converting step are variably changed as a function of a largest gain of the frequency characteristic added in the frequency characteristic adding step.

\* \* \* \* \*